US012796492B2

(12) United States Patent
Sio et al.

(10) Patent No.: US 12,796,492 B2
(45) Date of Patent: Nov. 10, 2026

(54) SEMICONDUCTOR DEVICES WITH BACKSIDE POWER DISTRIBUTION NETWORK AND FRONTSIDE THROUGH SILICON VIA

(71) Applicant: Taiwan Semiconductor Manufacturing Company, Ltd., Hsinchu (TW)

(72) Inventors: Kam-Tou Sio, Zhubei City (TW); Cheng-Chi Chuang, New Taipei City (TW); Chia-Tien Wu, Taichung City (TW); Jiann-Tyng Tzeng, Hsinchu (TW); Shih-Wei Peng, Hsinchu City (TW); Wei-Cheng Lin, Taichung City (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 459 days.

(21) Appl. No.: 18/232,713

(22) Filed: Aug. 10, 2023

(65) Prior Publication Data

US 2023/0387035 A1 Nov. 30, 2023

Related U.S. Application Data

(60) Continuation of application No. 17/452,188, filed on Oct. 25, 2021, now Pat. No. 11,842,967, which is a
(Continued)

(51) Int. Cl.
*H10W 70/60* (2026.01)
*H10W 70/05* (2026.01)
(Continued)

(52) U.S. Cl.
CPC ......... *H10W 70/614* (2026.01); *H10W 70/05* (2026.01); *H10W 70/09* (2026.01);
(Continued)

(58) Field of Classification Search
CPC ............. H01L 21/4853; H01L 21/4857; H01L 21/486; H01L 23/5383; H01L 23/5384;
(Continued)

(56) References Cited

U.S. PATENT DOCUMENTS 4,328,530 A 5/1982 Bajorek et al.
5,721,453 A 2/1998 Imai et al.
(Continued)

FOREIGN PATENT DOCUMENTS

TW 201227884 A1 7/2012
TW 201727859 A1 8/2017

*Primary Examiner* — Marlon T Fletcher
*Assistant Examiner* — Christina A Sylvia
(74) *Attorney, Agent, or Firm* — Sterne, Kessler, Goldstein & Fox P.L.L.C.

(57) ABSTRACT

The present disclosure describes a semiconductor structure having a power distribution network including first and second conductive lines. A substrate includes a first surface that is in contact with the power distribution network. A plurality of backside vias are in the substrate and electrically coupled to the first conductive line. A via rail is on a second surface of the substrate that opposes the first surface. A first interlayer dielectric is on the via rail and on the substrate. A second interlayer dielectric is on the first interlayer dielectric. A third interlayer dielectric is on the second interlayer dielectric. First and top interconnect layers are in the second and third interlayer dielectrics, respectively. Deep vias are in the interlayer dielectric and electrically coupled to the via rail. The deep vias are also connected to the first and top
(Continued)

interconnect layers. A power supply in/out layer is on the third interlayer dielectric and in contact with the top interconnect layer.

20 Claims, 12 Drawing Sheets

Related U.S. Application Data division of application No. 16/656,715, filed on Oct. 18, 2019, now Pat. No. 11,158,580.

(51) Int. Cl.
*H10W 70/09* (2026.01)
*H10W 70/63* (2026.01)
*H10W 70/65* (2026.01)
*H10W 70/685* (2026.01)
*H10W 70/652* (2026.01)

(52) U.S. Cl.
CPC ....... *H10W 70/093* (2026.01); *H10W 70/095* (2026.01); *H10W 70/611* (2026.01); *H10W 70/635* (2026.01); *H10W 70/65* (2026.01); *H10W 70/685* (2026.01); *H10W 70/6528* (2026.01)

(58) Field of Classification Search
CPC ............... H01L 23/5386; H01L 23/487; H01L 23/5226; H01L 23/5286; H01L 23/147; H01L 23/49816; H01L 23/50; H01L 23/5385; H01L 23/5389; H01L 24/19; H01L 24/02; H01L 24/13; H01L 2224/214; H01L 2224/131; H01L 2224/0404; H01L 2224/05091; H01L 25/0657; H01L 25/18; H01L 2225/06513; H01L 2225/06541; H01L 2225/06572; H10W 70/614; H10W 70/05; H10W 70/09; H10W 70/093; H10W 70/095; H10W 70/611; H10W 70/635; H10W 70/65; H10W 70/685; H10W 70/6528; H10W 20/0234; H10W 20/0242; H10W 20/421; H10W 20/481; H10W 80/00; H10W 90/00; H10W 72/252; H10W 72/29; H10W 72/9232; H10W 90/22; H10W 90/297; H10W 90/701; H10W 90/722; H10W 20/20; H10W 20/42; H10W 20/427; H10W 72/00; H10W 90/401; H10W 70/698
See application file for complete search history.

(56) References Cited

U.S. PATENT DOCUMENTS

| | | | | |
|---|---|---|---|---|
| 7,898,058 | B2 | 3/2011 | Lin et al. | |
| 8,154,128 | B2 | 4/2012 | Lung | |
| 8,164,171 | B2 | 4/2012 | Lin et al. | |
| 8,383,512 | B2 | 2/2013 | Chen et al. | |
| 8,385,131 | B2 | 2/2013 | Seol | |
| 8,928,149 | B2 | 1/2015 | Chen | |
| 10,068,874 | B2 | 9/2018 | Nelson et al. | |
| 10,177,032 | B2 | 1/2019 | Chen et al. | |
| 11,158,580 | B2 | 10/2021 | Sio et al. | |
| 2004/0238942 | A1 | 12/2004 | Chakravorty et al. | |
| 2010/0103634 | A1 | 4/2010 | Funaya et al. | |
| 2010/0224876 | A1 | 9/2010 | Zhu | |
| 2011/0121366 | A1 | 5/2011 | Or-Bach et al. | |
| 2011/0233676 | A1 | 9/2011 | Or-Bach et al. | |
| 2011/0266691 | A1 | 11/2011 | Lin et al. | |
| 2012/0193785 | A1* | 8/2012 | Lin | H01L 24/97 257/737 |
| 2013/0328208 | A1 | 12/2013 | Holmes et al. | |
| 2015/0091130 | A1* | 4/2015 | Yang | H10D 89/60 257/532 |
| 2015/0091181 | A1 | 4/2015 | Li et al. | |
| 2015/0364445 | A1 | 12/2015 | Choi et al. | |
| 2016/0093591 | A1 | 3/2016 | Lan et al. | |
| 2017/0125383 | A1* | 5/2017 | Liu | G11C 8/12 |
| 2017/0222153 | A1 | 8/2017 | Kawamura et al. | |
| 2018/0061753 | A1 | 3/2018 | Chang et al. | |
| 2018/0277475 | A1 | 9/2018 | Favre et al. | |
| 2019/0067194 | A1 | 2/2019 | Yu et al. | |
| 2019/0139915 | A1 | 5/2019 | Dalmia et al. | |
| 2019/0245543 | A1 | 8/2019 | Lee et al. | |
| 2020/0066641 | A1 | 2/2020 | Aygun et al. | |
| 2020/0083170 | A1 | 3/2020 | Cheah et al. | |
| 2022/0045011 | A1 | 2/2022 | Sio et al. | |
| 2025/0279358 | A1* | 9/2025 | Ting | H10W 20/069 |

* cited by examiner

SEMICONDUCTOR DEVICES WITH BACKSIDE POWER DISTRIBUTION NETWORK AND FRONTSIDE THROUGH SILICON VIA

CROSS-REFERENCE TO RELATED APPLICATIONS

This application is a continuation of U.S. patent application Ser. No. 17/452,188, titled "Semiconductor Devices with Backside Power Distribution Network and Frontside Through Silicon Via," filed Oct. 25, 2021, which is a divisional of U.S. patent application Ser. No. 16/656,715, titled "Semiconductor Devices with Backside Power Distribution Network and Frontside Through Silicon Via," filed Oct. 18, 2019, each of which is incorporated herein by reference in its entirety.

BACKGROUND

A three-dimensional integrated circuit ("3D IC") includes a semiconductor device with two or more layers of active electronic components integrated (e.g., vertically stacked and connected) to form an integrated circuit. 3D IC technologies include die-on-die stacking, die-on-wafer stacking, and wafer-on-wafer stacking. 3D IC systems with increased chip density can exhibit high IR drops (e.g., voltage drops) compared to their two-dimensional counterparts. Increased IR drops in 3D IC systems can lead to increased power consumption and degraded device performance.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
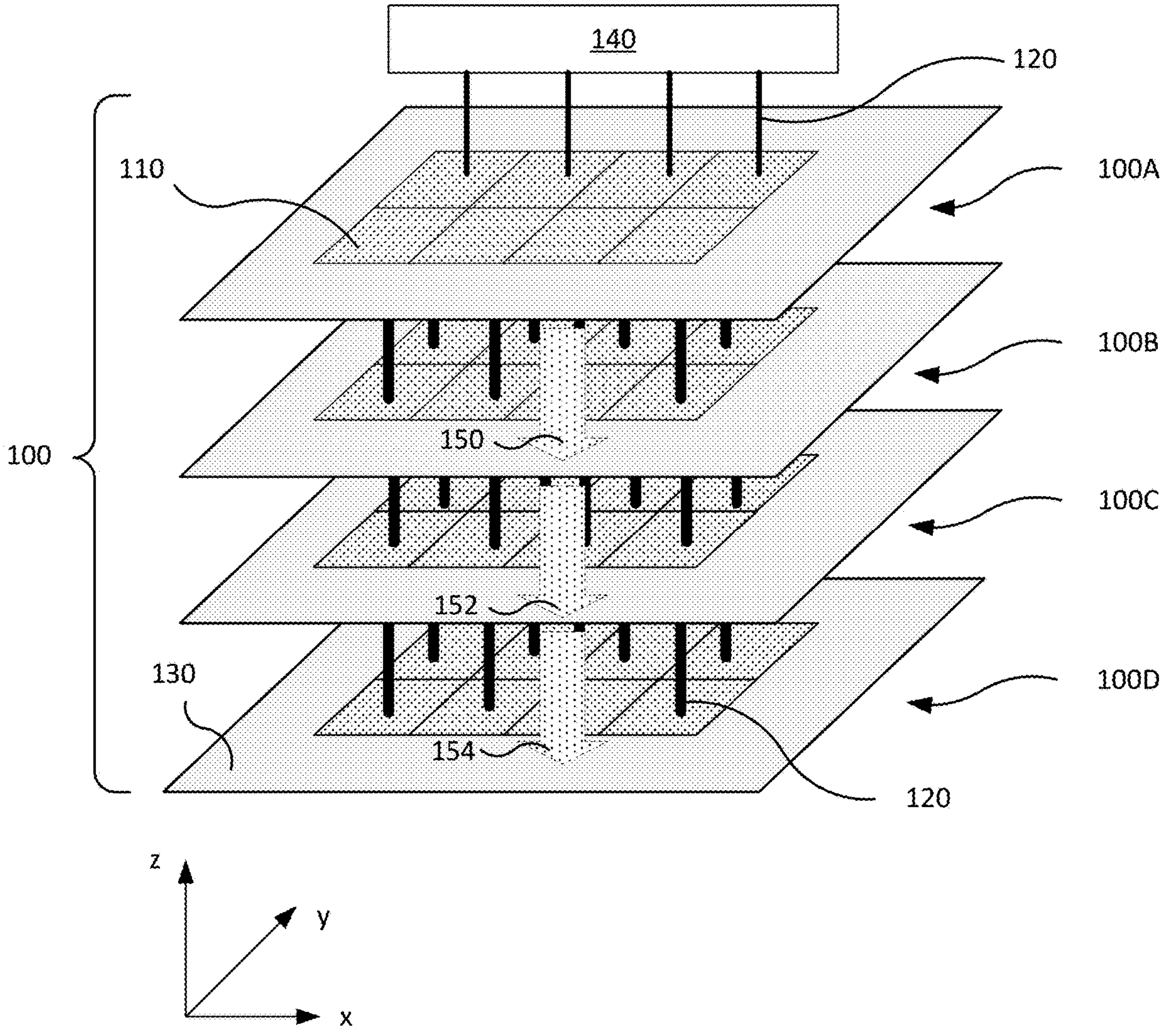
FIG. 1 is a partial isometric view of a three-dimensional system on integrated chip structure, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "vertical," as used herein, means nominally perpendicular to the surface of a substrate.

The terms "substantially" and "about" as used herein indicates the value of a given quantity that can indicate a value of a given quantity that varies within, for example, ±5% of a target (or intended) value (e.g., ±1%, ±2%, ±3%, ±4%, or ±5% of the value).

An integrated circuit ("IC") structure can include a compilation of layers with different functionality, such as interconnects, power distribution network, logic chips, memory chips, radio frequency (RF) chips, and the like. By way of example and not limitation, the logic chips can include central process units (CPUs) and the memory chips can include static access memory (SRAM) arrays, dynamic random access memory (DRAM) arrays, magnetic random access memory (MRAM) arrays, other types of memory arrays, or combinations thereof. A three-dimensional (3D) integrated circuit (3D IC) structure is a non-monolithic vertical structure developed based on the IC structure and can include, for example, two to eight two-dimensional (2D) flip chips stacked on top of each other through various bonding techniques, such as hybrid bonding. In IC and 3D IC structures, each of the layers can be interconnected by micro-bumps, through silicon vias (TSVs), hybrid bonding, other types of interconnect structures, or combinations thereof.

IC structures are powered by power wire grids including power lines and ground lines. Power wire grids can be electrically connected to one end of the IC package and supply power to each layer through conductive structures, such as power grid pillars formed by TSVs. However, as more layers are stacked on top of each other, increased layers of TSVs and interconnect structures in IC structures can lead to increased resistances and IR drops (e.g., greater than 5% voltage drop). In addition, TSVs used to deliver power to device layers through interconnect layers can occupy valuable routing space for signal lines, increase the resistance of interconnects and TSVs, deteriorate the performance of the chips, and reduce the lifetime of the IC structures.

To address the above shortcomings, embodiments described herein are directed to reducing IR drops in IC and/or 3D IC structures. For example, embodiments of the present disclosure include features such as (i) power distribution network formed on a backside of the IC structure; (ii) frontside deep through silicon via for delivering power to the backside power distribution network through interconnect layer and device layer; and (iii) via towers with frontside vias. The backside power distribution network and frontside deep through silicon vias can provide benefits of, among other things, (i) decrease IR drops from power source to embedded devices; and (ii) increase routing space for signal lines within the interlayer dielectric layer. It should be noted that the structures and methods described in the present application can also be applied to other conductive structures, such as signal carrying wires, ground wires, and any other suitable conductive structures.

According to some embodiments, FIG. 1 is an isometric illustration of a 3D IC structure 100. 3D IC structure 100 includes four chip layers (e.g., 100A, 100B, 100C, and 100D); however, the number of chip layers is not limiting and fewer or additional chip layers are possible (e.g., 2, 6, or 8). For illustration purposes, FIG. 1 includes select portions of a 3D IC structure and other structures (not shown) may be included and not illustrated for clarity. For example, micro-bumps, molding regions, dummy regions, adhesion layers, a heat sink, interconnects, ball grid array (BGA) connectors, silicon interposers, and other components or structural elements may be included. In some embodiments, peripheral structures 130 can provide mechanical support and/or provide thermal conduction for heat dissipation. Each chip layer can include one or more device layers 110, which are electrically connected to chips in adjacent chip layers through vertical electrical conductive structures 120. In some embodiments, vertical electrical conductive structures 120 can include TSVs, through dielectric vias (TDVs), other types of vertical interconnect structures, or combinations thereof. By way of example and not limitation, top chip layer 100A can include one or more microprocessors or CPUs, while chip layers 100B through 100D can include one or more memory chips (e.g., SRAM chips, DRAM chips, MRAM chips, other types of memory chips, or combinations thereof). Prior to stacking, a contact surface of each chip is planarized and chips are bonded at these contact surfaces using suitable bonding technologies, such as hybrid bonding, fusion bonding, anodic bonding, direct bonding, room temperature bonding, pressure bonding, and/or combinations thereof.

In some embodiments, power supply 140 is electrically connected to top chip layer 100A through interconnects, such as BGA connectors. The power is supplied to chip layers 100A to 100D through vertical electrical conductive structures 120. As power is provided in series through chip layers 100A through 100D, electrical resistance of each chip layer will introduce an IR drop in the voltage supply for the subsequently bonded chip layer which in turn leads to undesirable increased power consumption. For example, due to electrical resistances caused by the power grid structures and hybrid bonded surfaces, IR drops 150, 152, or 154 can occur between chip layers 100A through 100D, and chip layer 100D would receive a voltage supply lower than power supply 140 that is supplied to chip layer 100A. As an increased number of chips are stacked in 3D IC structures, chip layers further away from the power supply (e.g., chip layer 100D) can experience undesirable IR drops (e.g., greater than 5% of the voltage supply). Undesirable IR drops also occur in each chip layer 100A-100D, where power supplied to one side of a chip layer (e.g., top surface of chip layer 100A) is greater than the power level at an opposing side of the chip layer (e.g., bottom surface of chip 100A). To address the above shortcomings, various structures of the present disclosure are directed to reducing IR drops in IC and/or 3D IC structures.

Figure 2:
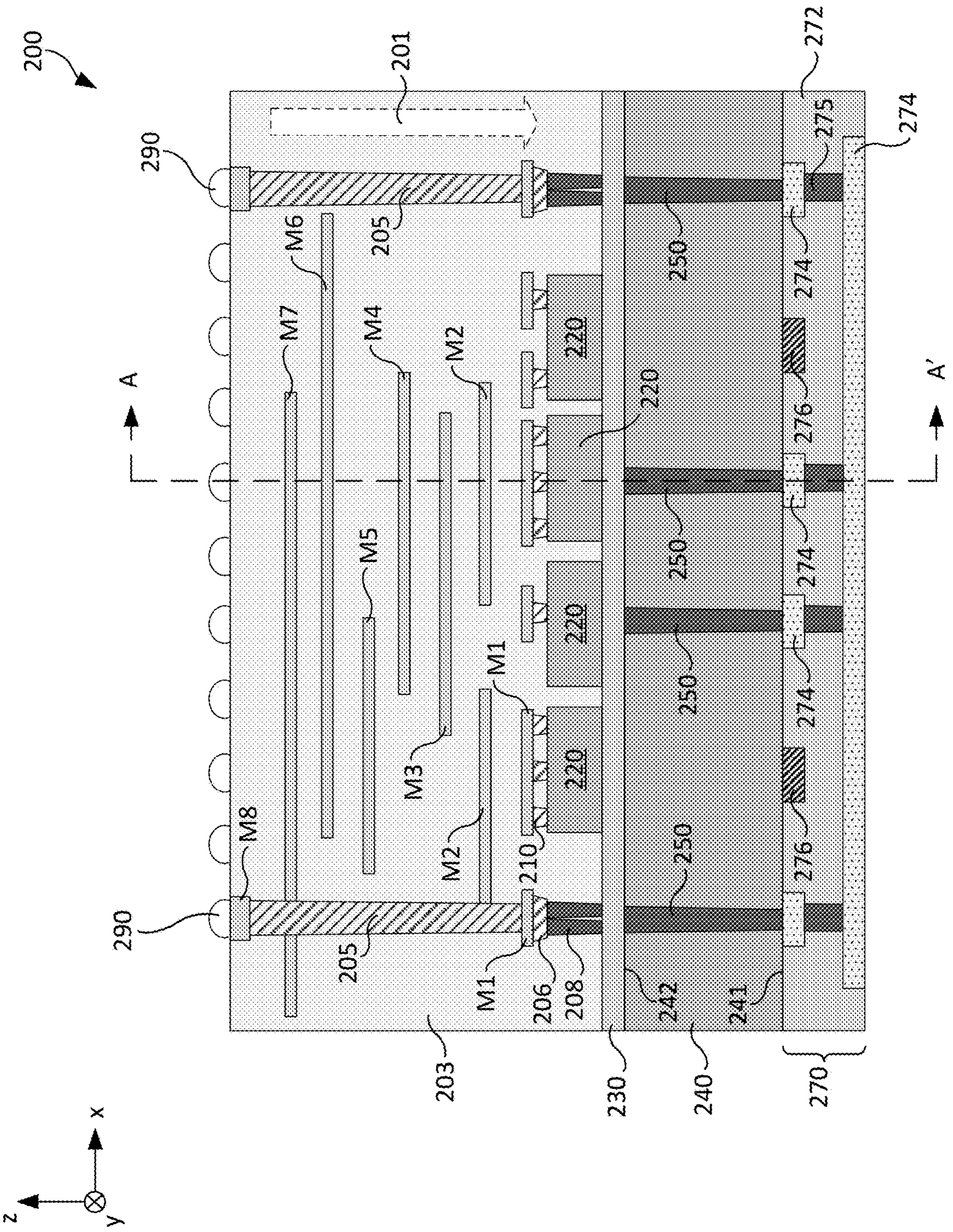
FIGS. 2 and 3 are cross-sectional views of an integrated chip structure having reduced IR drops, according to some embodiments.
Figure 3:
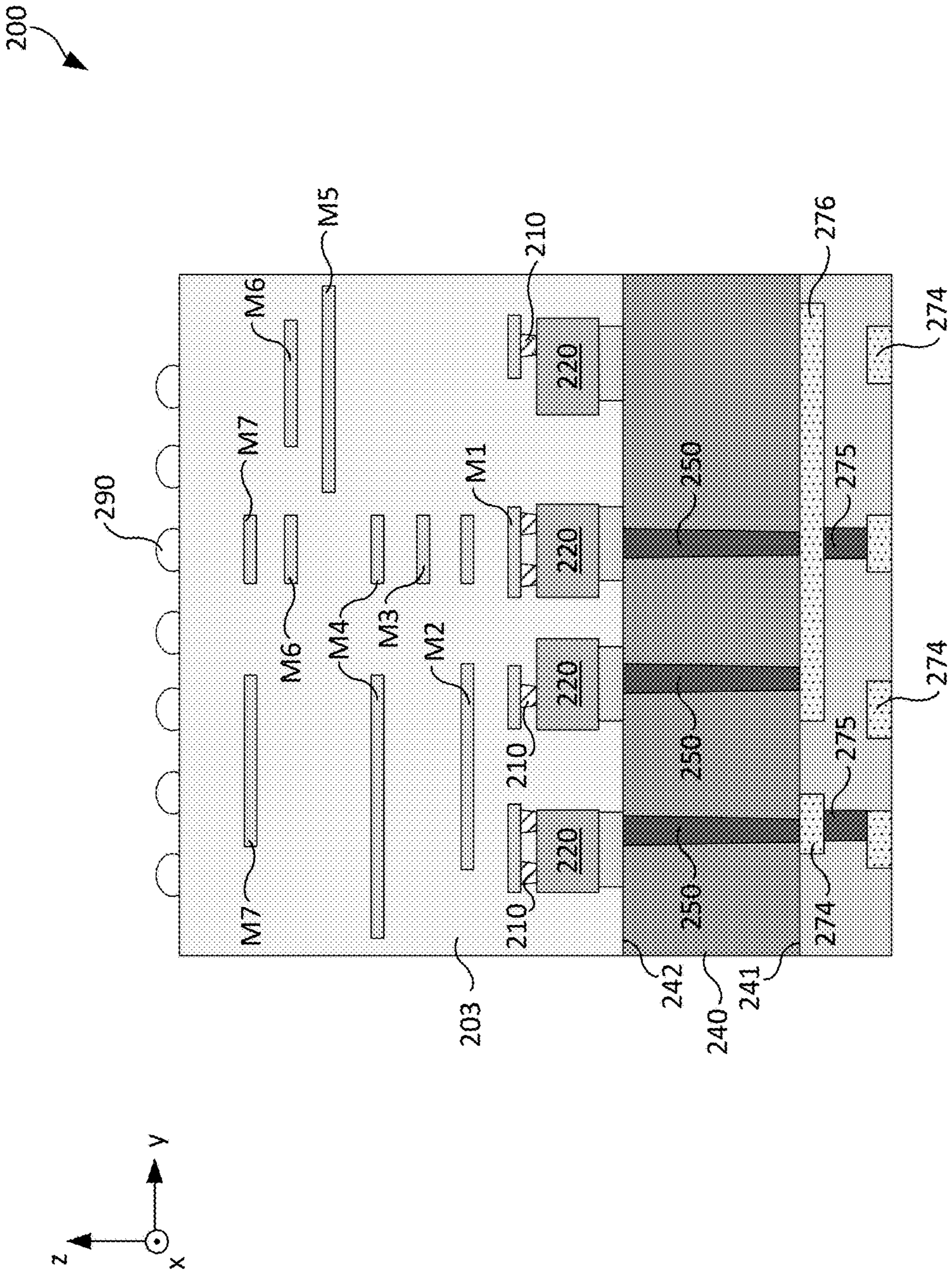

FIGS. 2 and 3 are cross-sectional views of an IC structure 200 incorporating backside power distribution network and frontside deep through silicon vias (TSVs), according to some embodiments. IC structure 200 can be a semiconductor device that includes package bumps 290, interlayer dielectric 203, deep TSVs 205, metals lines M1-M8, vias 206, vias 208, vias 210, semiconductor devices 220, via rail 230, substrate 240, backside TSVs 250, backside power distribution network (PDN) 270, and backside dielectric layer 272. IC structure 200 can further include other suitable structures and are not illustrated in FIGS. 2 and 3 for simplicity. FIG. 3 illustrates a cross-sectional view of IC structure 200 through a longitudinal axis of IC structure 200 denoted as A-A' in FIG. 2. As shown in FIG. 3, PG wire 276 extends in both horizontal directions (e.g., in the x and y directions). Similarly, metal lines M1-M7 also extend in both horizontal directions. Components in IC structure 200 are for illustration purposes and are not drawn to scale.

Electrical connection can be formed between layers stacked chips through conductive structures embedded in their respective dielectric layers. As electrical power and/or signals are transmitted from package bumps 290 to semiconductor devices 220, for example, in a direction illustrated as direction 201, the power supply to semiconductor devices 220 decreases due to electrical resistances. The electrical resistances can arise, for example, due to internal structures within each metal layer embedded in the interlayer dielectric or through interconnect structures between adjacent metal layers. IC structure 200 in FIG. 2 incorporates deep TSVs and backside power distribution network 270 to reduce the IR drops. For example, deep TSVs are formed in interlayer dielectric 203 to transmit power directly to via rail 230 for transmitting power to semiconductor devices 220 and to backside PDN 270 for distributing power to other suitable devices in IC structure 200.

IC structure 200 includes substrate 240. Substrate 240 can be a p-type substrate, such as a silicon material doped with a p-type dopant (e.g., boron). In some embodiments, substrate 240 can be an n-type substrate, such as a silicon material doped with an n-type dopant (e.g., phosphorous or arsenic). In some embodiments, substrate 240 can include, germanium, diamond, a compound semiconductor, an alloy semiconductor, a silicon-on-insulator (SOI) structure, any other suitable material, or combinations thereof. Substrate 240 can be include sensor devices, transistors, application-specific integrated circuit (ASIC), field programmable gate array (FPGA), memory device, microelectromechanical system (MEMS), any suitable device, or any combination thereof.

Backside PDN 270 can be formed on a first surface 241 of substrate 240. Backside PDN 270 can include power grid (PG) wires 274 and 276 embedded in backside dielectric layer 272. Backside PDN 270 also includes backside TSVs 275 providing electrical connection between PG wires. In some embodiments, PG wires 274 and 276 can be electrically connected to the same voltage level, such as $V_{SS}$ (e.g., ground voltage reference) or $V_{DD}$ (e.g., power supply voltage reference) of integrated circuit power supply lines. In some embodiments, PG wires 274 and 276 can be electrically connected to different voltage sources. For example PG wires 274 can be connected to $V_{DD}$, and PG wires 276 can be connected to $V_{SS}$. In some embodiments, PG wires 274 and 276 can be formed of conductive materials, such as copper, aluminum, cobalt, tungsten, metal silicides, highly-conductive tantalum nitride, any suitable conductive materials, and/or combinations thereof. In some embodiments, PG wires can extend in a horizontal direction (e.g., x or y direction). For example, PG wires 274 shown in FIG. 2 extend in both x and y directions while PG wires 276 extend in the y direction.

Backside dielectric layer 272 is in physical contact with first surface 241 of substrate 240. can be formed using dielectric materials, such as silicon oxide, undoped silica glass, fluorinated silica glass, other suitable materials, and/or combinations thereof. In some embodiments, backside dielectric layer 272 is formed using a low-k dielectric material (e.g., material with a dielectric constant less than 3.9). In some embodiments, backside dielectric layer 272 can include two or more insulating material layers, which are not shown in FIG. 2 for simplicity. In some embodiments, backside dielectric layer 272 can be formed by depositing a dielectric material on first surface 241. In some embodiments, backside dielectric layer 272 can be formed by bonding a wafer to the first surface 241 through suitable wafer bonding processes, such as direct bonding, room temperature bonding, hybrid bonding, anodic bonding, any suitable wafer bonding processes, and/or combinations thereof.

Backside vias 275 are embedded in backside dielectric layer 272 and provide electrical connection between PG wires. In some embodiments, backside vias 275 can be formed of a conductive material, such as copper, aluminum, cobalt, tungsten, any suitable conductive material, and/or combinations thereof. In some embodiments, backside vias 275 can be formed using a damascene process.

Backside TSVs 250 are vias that are formed through substrate 240. In some embodiments, backside TSVs 250 can be high aspect ratio vias (e.g., vias having aspect ratios greater than about 20). Similar to backside vias 275, backside TSVs 250 can also be formed of a conductive material, such as copper, aluminum, cobalt, tungsten, metal silicides, highly-conductive tantalum nitride, any suitable conductive material, and/or combinations thereof. In some embodiments, backside TSVs 250 can be formed using a damascene process.

Via rails 230 can be formed on a second surface 242 of substrate 240. Via rails 230 can be electrical lines that are electrically connected to backside TSVs 250 to transmit power supply or electrical signals. In some embodiments, via rail 230 can be formed using conductive material, such as copper, aluminum, cobalt, tungsten, metal silicides, highly-conductive tantalum nitride, any suitable conductive material, and/or combinations thereof. In some embodiments, via rail 230 can be formed using a damascene process.

ILD 203 can be formed on via rails 230 and second surface 242 of substrate 240. ILD 203 can include a dielectric material. In some embodiments, the dielectric material can include silicon oxide, silicon nitride, silicon oxynitride, spin-on glass (SOG), fluorinated silica glass (FSG), carbon doped silicon oxide (e.g., SiCOH), amorphous fluorinated carbon, Parylene, bis-benzocyclobutenes, polyimide, other proper porous polymeric materials, other suitable dielectric materials, and/or combinations thereof. In some embodiments, ILD 203 can include a high density plasma (HDP) dielectric material (e.g., HDP oxide) and/or a high aspect ratio process (HARP) dielectric material (e.g., HARP oxide). In some embodiments, interlayer dielectric 203 can be formed using a low-k dielectric material. ILD 203 can also include one or more dielectric layers and/or one or more conductive layers. In some embodiments, ILD 203 can include metal layers, via layers, etch stop layers, One or more planarization process can be used to planarize the top surface of ILD 203. ILD 203 can be deposited by CVD, PVD, FCVD, ALD, PECVD, any suitable deposition methods, and/or combinations thereof. Interconnect structures, interlayer dielectrics, and device layers can be formed in ILD 203 and over via rails 230 and substrate 240. Interlayer dielectric 203 can include multiple layers; for example, different interlayer dielectric layers can be used to provide physical and electrical isolation between conductive layers. The multiple interlayer dielectric layers in ILD 203 are not illustrated in FIG. 2 for simplicity.

In some embodiments, semiconductor devices 220 can be formed on via rails 230 and embedded in interlayer dielectric 203. Semiconductor devices 220 can include passive/active devices, such as capacitors, inductors, and/or transistors, arranged to be CMOS circuits, RF circuitry, logic circuits, peripheral circuitry, and the like. In some embodiments, semiconductor devices 220 can include fin field-effect transistors (finFETs) with gate terminals and source/drain terminals. In some embodiments, semiconductor devices 220 can be planar transistor devices.

Metal lines can be formed in interlayer dielectric 203 to form interconnect structures. For example, metal lines M1-M8 can be metallization layers of a back-end-of-line (BEOL) interconnect structure. For example, metal line M1 can be a first metallization layer that is connected to terminals of semiconductor devices 220 through vias. Metal line M2 can be a second metallization layer that is above metal line M1 and electrically connected to metal line M1 through vias. Metal lines M3-M8 can be metallization lines subsequently formed in interlayer dielectric 203 that are electrically connected to transmit power and/or signals. Interconnect structures, such as vias, can be formed in ILD 203 and between suitable metallization layers to provide electrical connection between the metal lines of different metallization layers. For example, vias can be formed between adjacent metal lines, such as metal lines M1 and M2, or between other suitable non-adjacent metal lines, such as metal lines M3 and M5. Vias can be formed in ILD 203 using conductive material, such as copper, silver, tungsten, aluminum, cobalt, any suitable conductive material, and/or combinations thereof. The vias between metal lines are not illustrated in FIG. 2 for simplicity.

Vias 210 can also be formed in interlayer dielectric 203 to provide electrical connection between terminals of semiconductor devices 220 and metal lines M1. In some embodiments, vias 210 can be formed of a conductive material, such as copper, aluminum, cobalt, tungsten, any suitable conductive material, and/or combinations thereof. In some embodiments, vias 210 can be formed using a damascene process.

Vias 206 and 208 are formed in interlayer dielectric 203 and are electrically coupled to via rail 230. In some embodiments, vias 206 are formed in the same level as vias 210. In some embodiments, vias 208 include multiple vias formed in parallel between vias 206 and via rail 230, as illustrated in FIG. 2. In some embodiments, vias 208 are in physical contact with via rail 230. In some embodiments, vias 206 and 208 can be formed of a conductive material, such as copper, aluminum, cobalt, tungsten, any suitable conductive material, and/or combinations thereof. In some embodiments, vias 206 and 208 can be formed using a damascene process.

Deep TSVs 205 are formed in interlayer dielectric 203 to transmit power to semiconductor devices 220 and other suitable structures in IC structure 220, while reducing IR drop (e.g., less than 5%) between the power source electrically connected to a top end of deep TSV 205 and the receiving terminal of semiconductor devices 220. First, deep TSVs 205 can be a single via that extends through interlayer dielectric 203 that connects both a top metal layer (e.g., metal line M8) and a bottom metal layer (e.g., metal line M1) that is in proximity of semiconductor devices 220, therefore reducing contact resistance caused by multiple shorter vias connected between each metal layer. Second, deep TSVs 205 also transmit power to backside PDN which distributes power throughout IC structure 200. The backside PDN can distribute power with less IR loss because PG wires 274 and 276 can have greater lateral and vertical dimensions than metal layers M1 through M8 which in turn reduces resistance for transmitting electrical power or signals. Backside PDN also increases routing space within interlayer dielectric 203 for electrical signal routing. Deep TSVs 205 can be formed of a conductive material, such as copper, aluminum, cobalt, tungsten, any suitable conductive material, and/or combinations thereof. In some embodiments, deep TSVs 205 can be formed using a damascene process. For example, a trench can be formed in interlayer dielectric 203 that exposes portions of metal line M1, and a conductive material is deposited to fill the trench. In some embodiments, deep TSVs 205 can have a high aspect ratio (e.g., ratio of height over width). For example, aspect ratios of TSVs 205 can be between about 20 and about 30. In some embodiments, metal layer M8 can be formed on TSVs 205.

Package bumps 290 are conductive structures, such as solder balls, that can be electrically connected to power supplies or other packages to form package on package (PoP) structures. In some embodiments, there can be under bump metallization (UBM) structures formed underneath their respective package bumps 290. In some embodiments, package bumps can be used to transmit electrical signals.

Figure 4:
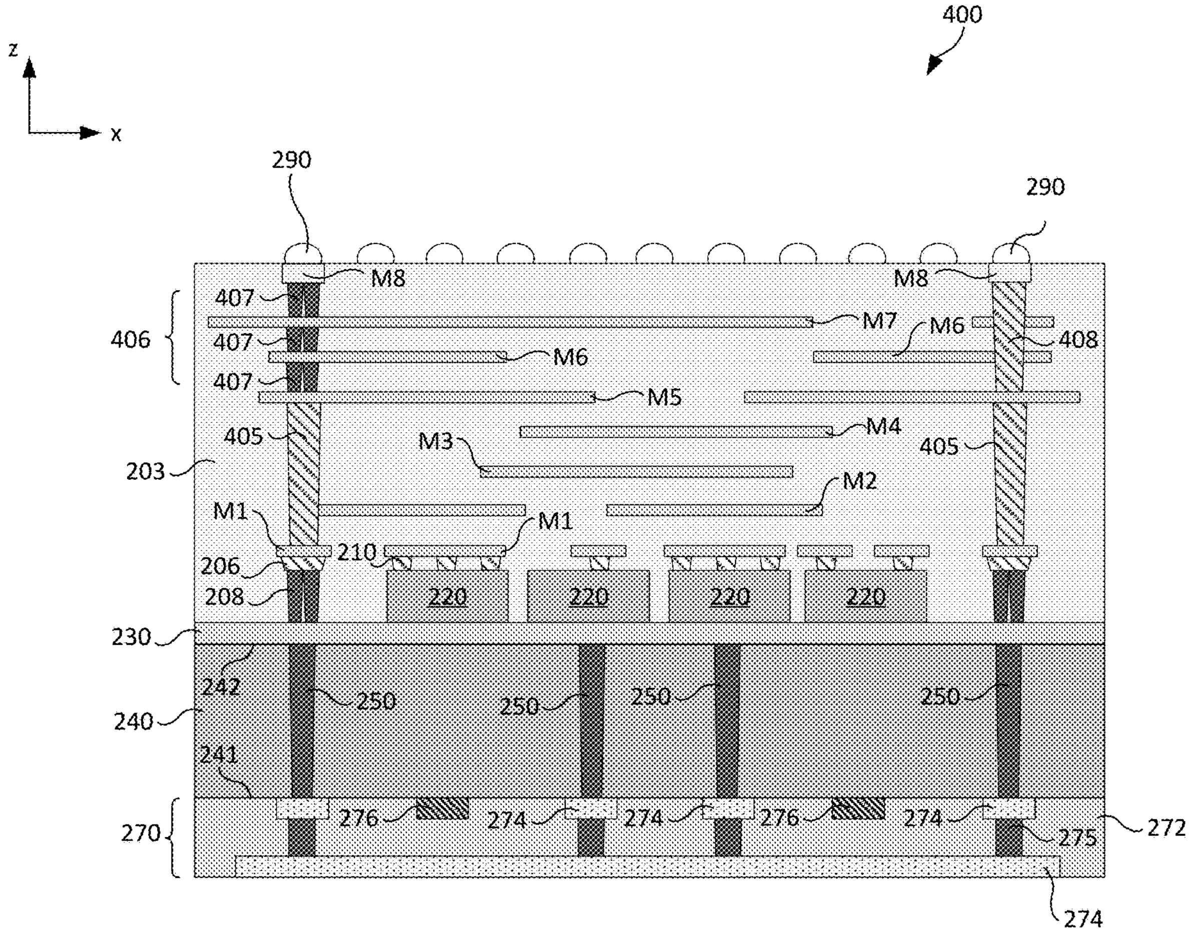
FIGS. 4 and 5 are cross-sectional views of various configurations of integrated chip structures having reduced IR drops, according to some embodiments.

FIG. 4 illustrates a cross-sectional view of IC structure 400 incorporating deep TSVs 405 and a via tower 406, according to some embodiments. Elements with the same numeral labels in FIGS. 2 and 4 are directed to the same structure of materials and are not repeated for simplicity. Similar to deep TSVs 205 illustrated in FIGS. 2 and 3, deep TSVs 405 are also formed in interlayer dielectric 203 and form electrical connections between a metal line and a via rail. However, one end of deep TSV 405 can be connected to a mid-level metal line (e.g., metal line M5) rather than a topmost metal line (e.g., metal line M8). Electrical connection between metal lines M5 and M8 can be achieved by via towers 406 that includes tower vias 407 formed between each pair of adjacent metal lines, such as metal lines M5 and M6, M6 and M7, and M7 and M8. Although tower vias 407 can have lateral and vertical dimensions smaller than deep TSVs 405, tower vias 407 also provide reduced IR drops and can be placed at any suitable location above deep TSVs 405. In some embodiments, a lateral width of tower vias 407 can be between about 1 μm and about 250 μm. In some embodiments, the lateral width of tower vias 407 can be substantially equal to about a width of a poly gate or metal gate structure for semiconductor transistor devices. In some embodiments, vertical dimensions of tower vias 407 can be between about 1 and about 50 times the height of the poly gate or metal gate structure. In some embodiments, tower vias 407 are in close proximity and formed above deep TSVs 405. In some embodiments, the thickness of interlayer dielectric 203 can exceed fabrication limits for forming deep TSVs that connect a top metal line (e.g., metal line M8) and a bottom metal line (e.g., metal line M1). Fabrication limits can include forming TSVs with high aspect ratio without forming voids within the deep TSVs. Therefore, via tower 406 can provide electrical connections between the top metal line (e.g., metal line M8) and the mid-level metal line (e.g., metal line M5) that is connected to deep TSV 405. In addition, via tower 406 can include tower vias 407 between adjacent metal lines (e.g., metal lines M5 and M6) that can provide design flexibility to place each tower via 407 at suitable locations. In some embodiments, a deep TSV 408 can be formed above deep TSV 405 to provide electrical connection between top metal line M8 and mid-level metal line M5. As deep TSVs 405 and 408 can be single vias that are greater in diameter than tower vias 407, IR drops along deep TSVs 405 and 408 can be less than vias tower 406 along a vertical direction (e.g., z direction). However, the choice of deep TSVs 405 over via tower 406 can depend upon specific design needs, such as reducing IR drops and greater design flexibility. For example, deep TSVs provide less IR drop but via tower 406 provides greater design flexibility. Deep TSVs 405 and via tower 406 can be formed using materials similar to deep TSV 205. For example, deep TSV 405 and via tower 406 can be formed of copper. In some embodiments, deep TSV 405 and tower vias 407 of via tower 406 can be formed using a damascene process.

Figure 5:
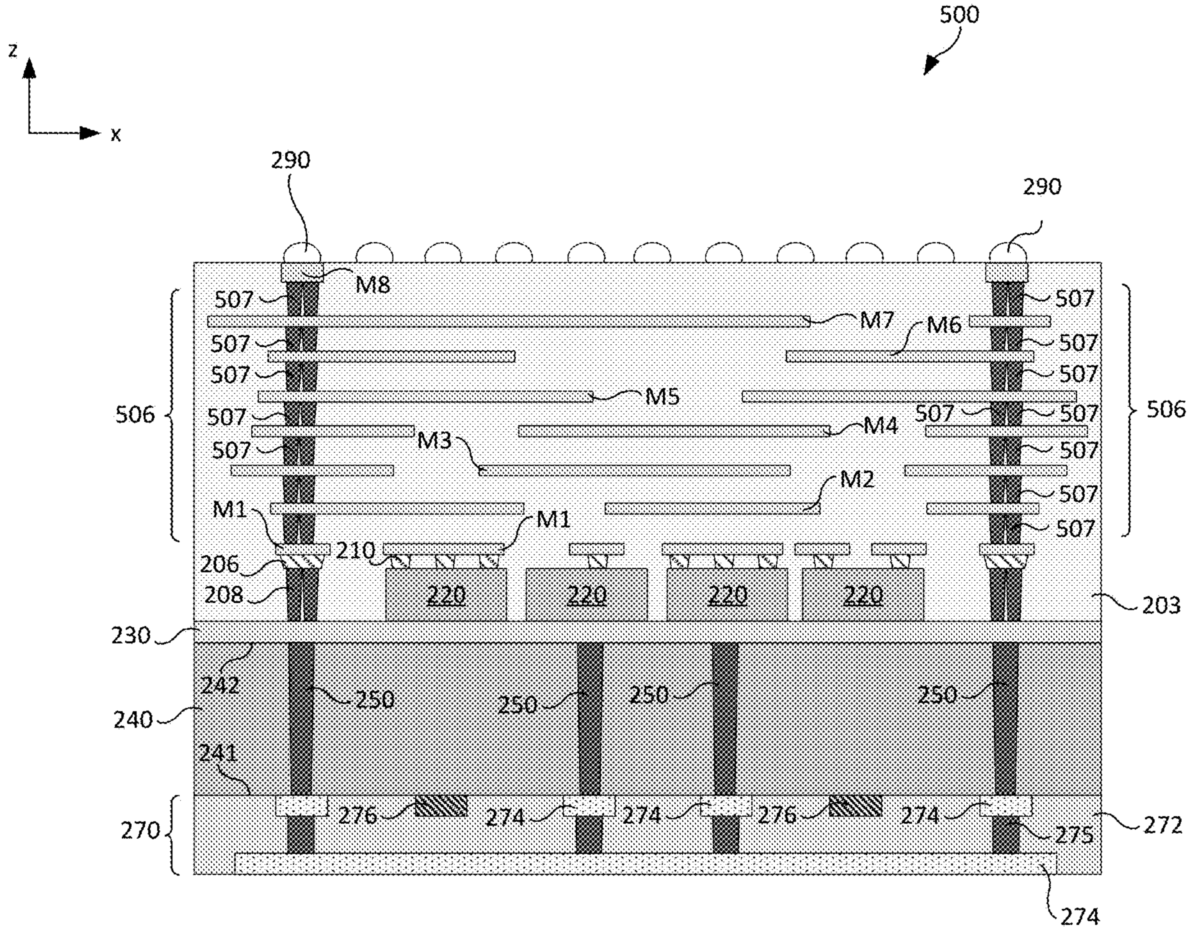

FIG. 5 illustrates a cross-sectional view of IC structure 400 incorporating via tower structures 506, according to some embodiments. Elements with the same numeral labels in FIGS. 2 and 5 are directed to the same structure of materials and are not repeated for simplicity. Via towers 506 include tower vias 507 formed between adjacent metal lines. For example, tower vias 507 can be formed between metal lines M1 and M2. Similar to via towers 406 described in FIG. 4, via towers 506 can provide reduced IR drops and greater design flexibility. Via towers 506 can be formed using materials similar to deep TSVs 205 or 405. For example, via towers 506 can be formed of copper. In some embodiments, via towers 506 can be formed using a damascene process.

Figure 6:
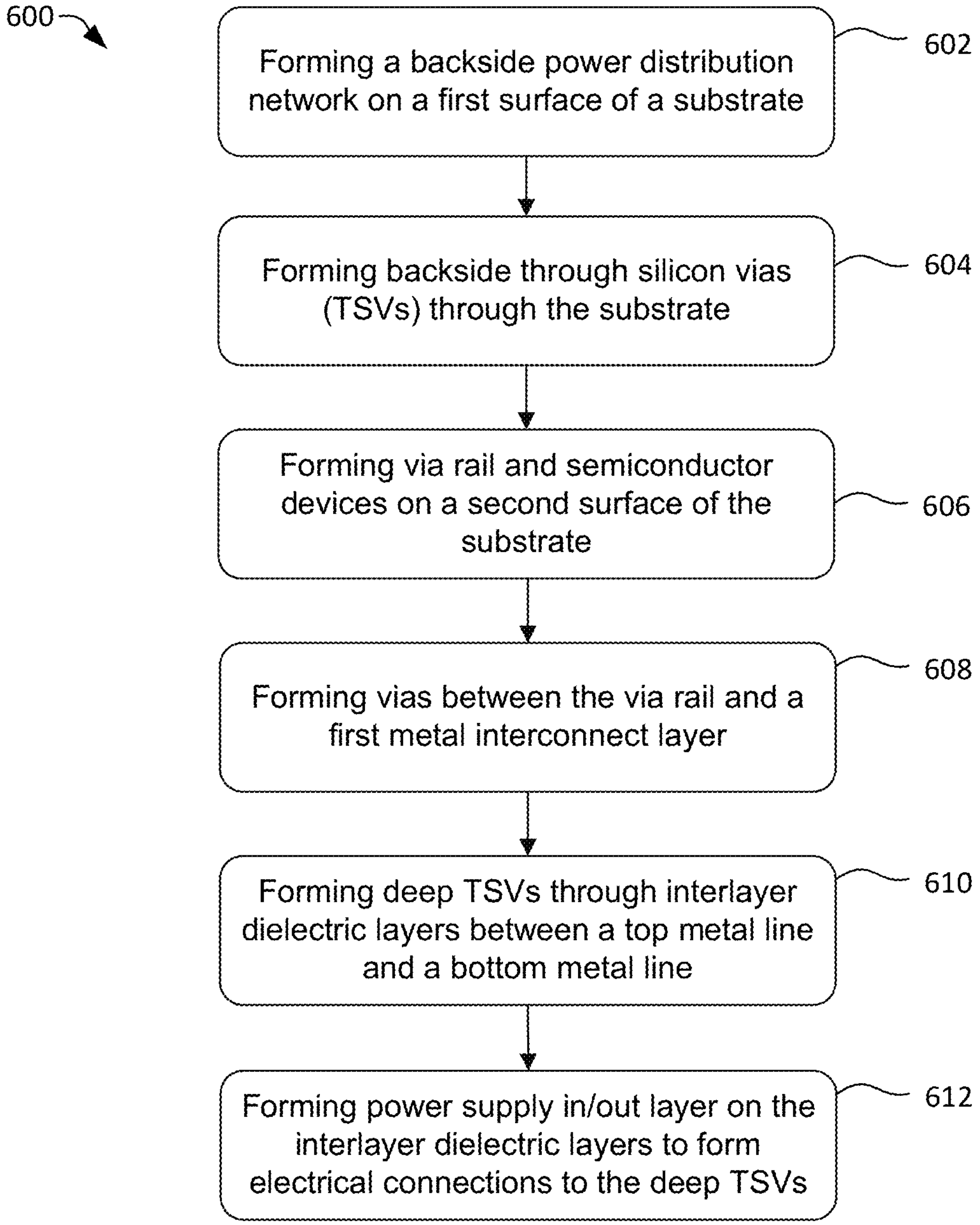
FIG. 6 is a flow diagram of a method for forming IC structures with reduced IR drops, according to some embodiments.

FIG. 6 is a flow diagram of a method 600 for forming deep TSVs and a backside PDN in semiconductor devices, in accordance with some embodiments of the present disclosure. It should be noted that operations of method 600 can be performed in a different order and/or vary, and method 600 may include more operations and are not described for simplicity. FIGS. 7-12 are cross-sectional views of fabricating an exemplary semiconductor structure incorporating deep TSVs and the backside PDN. FIGS. 7-12 are provided as exemplary cross-sectional views to facilitate in the explanation of method 600. The semiconductor structure illustrated in FIGS. 7-12 can include substrate 740 that is similar to substrate 240 described in FIG. 2 and is not described in detail for simplicity. In some embodiments, substrate 740 can include various suitable devices or embedded structures and are not illustrated for simplicity. Although fabrication processes of deep TSVs and the backside PDN are described as examples, the fabrication process can be applied in various semiconductor structures. The described fabrication processes are exemplary, and alternative processes in accordance with this disclosure may be performed that are not shown in the figures.

Figure 7:
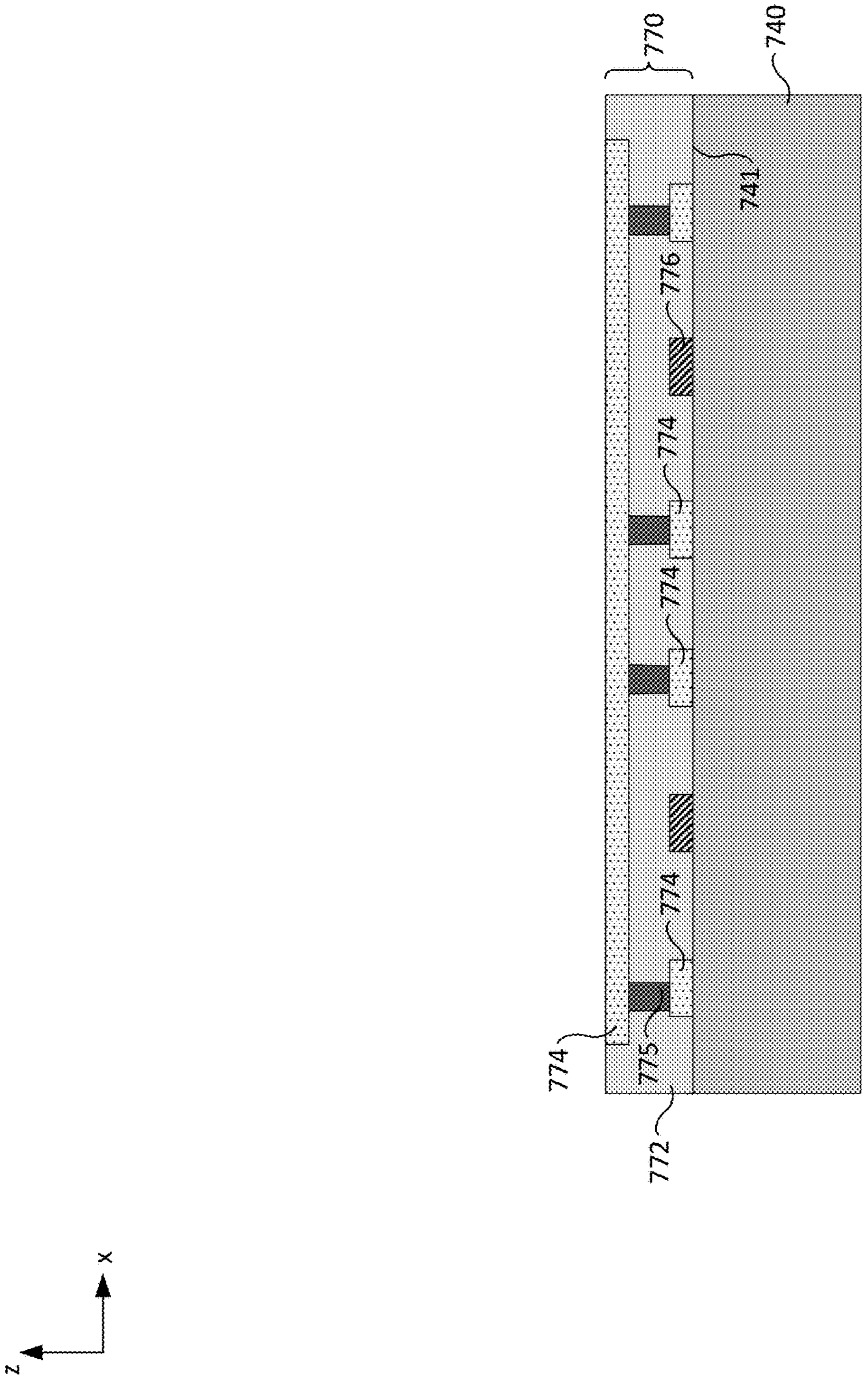
FIG. 7-12 illustrate various fabrication stages of integrated chip structures with reduced IR drops, according to some embodiments.

At operation 602, a backside PDN is formed on a first surface of a substrate, according to some embodiments of the present disclosure. Referring to FIG. 7, a backside PDN 770 is formed on a first surface 741 of substrate 740. Backside PDN 770 can include backside dielectric layer 772 and PG wires 774 and 776 embedded therein. PG wires 774 and 776 can be formed using suitable processes, such as a damascene process, and backside dielectric layer 772 can include more than one dielectric layers that are not illustrated in FIG. 7 for simplicity. For example, PG wires 774 and 776 can be formed by depositing a dielectric layer on a first surface followed by a patterning process to open trenches for subsequent metal deposition. Metal material can be deposited into the trenches and a planarization process can be performed such that top surfaces of PG wires 774 and 776 are substantially co-planar with the deposited dielectric layer. In some embodiments, backside dielectric layer 772 can be deposited by chemical vapor deposition (CVD), plasma-enhanced CVD (PECVD), atomic layer deposition (ALD), physical vapor deposition (PVD), flowable CVD (FCVD), any other suitable process, or combinations thereof. In some embodiments, backside dielectric layer 772 can be formed using similar material as backside dielectric layer 270 described above in FIG. 2. PG wires 774 and 776 can be formed using CVD, PVD, ALD, electroplating, electroless plating, any suitable deposition process, and/or combinations thereof. In some embodiments, PG wires 774 and 776 can be formed using similar material as PG wires 274 and 276. In some embodiments, PG wires 774 can be connected to $V_{DD}$, and PG wires 776 can be connected to $V_{SS}$. In some embodiments, backside PDN 770 can be formed by bonding a PDN wafer to substrate 740 at surface 741.

Figure 8:
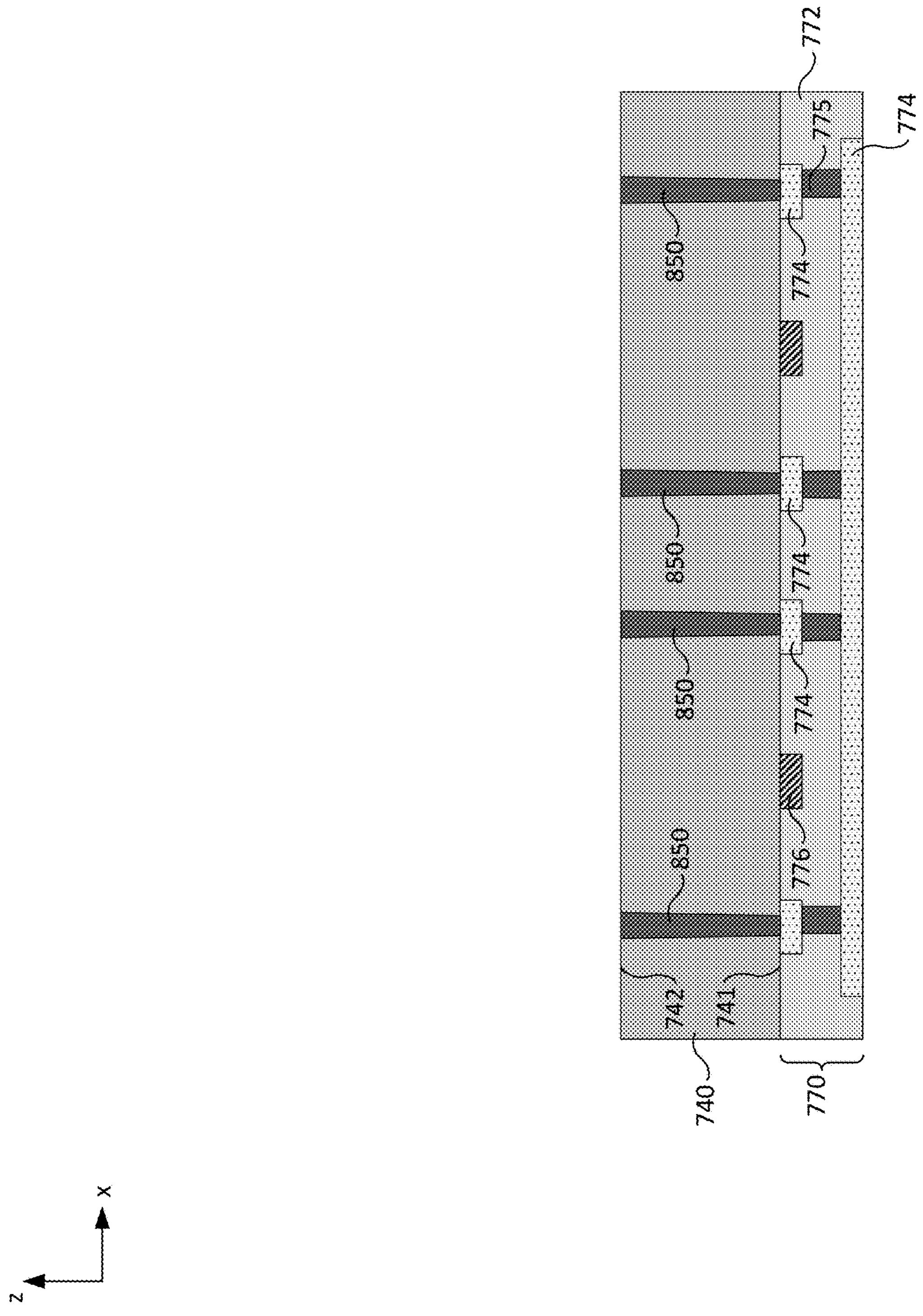

At operation 604, backside TSVs are formed in the substrate, according to some embodiments of the present disclosure. Referring to FIG. 8, backside TSVs 850 are formed in substrate 740 and are electrically connected to PG wires, such as PG wires 774. In some embodiments, backside TSVs 850 are formed by patterning and etching processes that form openings in substrate 740. Conductive material is deposited in the openings. The patterning process can include forming a photoresist layer overlying substrate 740, exposing the photoresist layer to a pattern, performing post-exposure bake processes, and developing the photoresist layer to form a masking element including the resist. The masking element can protect regions of substrate 740, while etch processes are used to form openings in substrate 740. The etching process can be a reactive ion etch (RIE) process and/or other suitable process. The etching process can continue until underlying PG wires 774 are exposed. After an opening is formed, the conductive material can be deposited into the one or more openings using any suitable deposition method, such as CVD, PVD, ALD, electro plating, electroless plating, any suitable deposition process, and/or combinations thereof. After the conductive material is deposited, a planarization process, such as chemical mechanical polishing (CMP) process, can be performed such that top surfaces of backside TSVs 850 are substantially co-planar with a second surface 742 of substrate 740.

Figure 9:
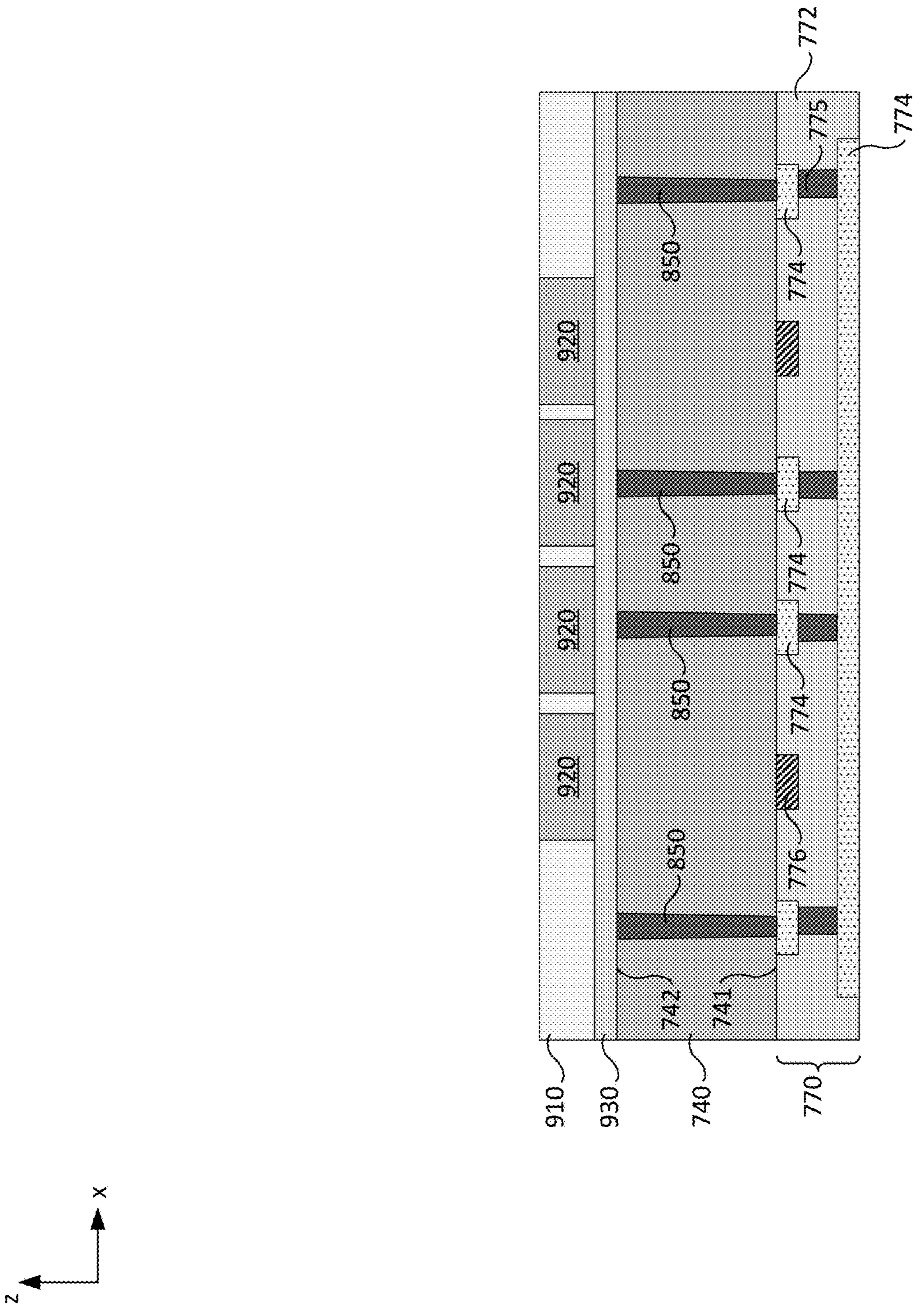

At operation 606, via rail and semiconductor devices are formed on a second surface of the substrate, according to some embodiments of the present disclosure. Referring to FIG. 9, via rail 930 and semiconductor devices 920 are formed on a second surface 742 of substrate 740. In some embodiments, via rail 930 can be a conductive line extending horizontally (e.g., x direction) and portions of semiconductor devices 920 can be formed on via rail 930. In some embodiments, portions of semiconductor devices 920 can also be formed on second surface 742 of substrate 740. Via rail 930 can be formed using conductive materials, such as copper, cobalt, aluminum, tungsten, doped polysilicon, other suitable conductive material, and/or combinations thereof. In some embodiments, via rail 930 can be formed using deposition processes, such as CVD, PVD, ALD, any suitable deposition processes, and/or combinations thereof. In some embodiments, semiconductor devices 920 can include passive/active devices, such as capacitors, inductors, and/or transistors arranged to be CMOS circuits, RF circuitry, and the like. As described above with reference to FIGS. 2-5, interlayer dielectrics can include multiple dielectric layers. As shown in FIG. 9, interlayer dielectric 910 can be a portion of an interlayer dielectric structure, and semiconductor devices 920 can be formed in interlayer dielectric 910. In some embodiments, interlayer dielectric 910 can be formed of suitable dielectric material, such as a low-k dielectric material. In some embodiments, interlayer dielectric 910 can be formed using silicon oxide or silicon nitride. The process for forming semiconductor devices 920 is not described here in detail for simplicity.

Figure 10:
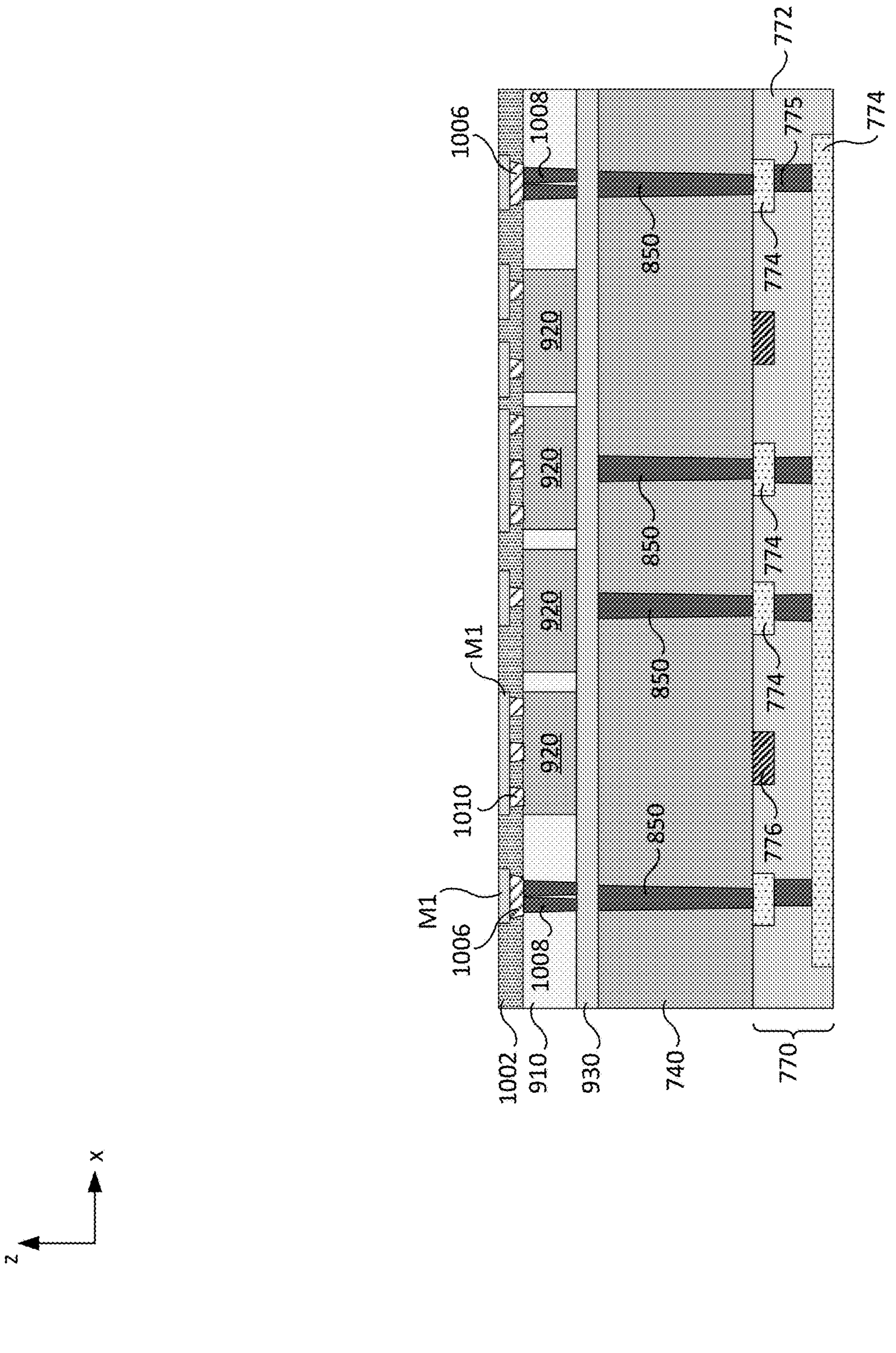

At operation 608, vias are formed between via rail and a first metal interconnect layer, according to some embodiments of the present disclosure. Referring to FIG. 10, conductive structures including vias 1006 and 1008 are formed between via rail 930 and first metal interconnect layer M1. Vias 1006 and 1008 can provide electrical connection between subsequently formed interconnect structure and via rail 930. In some embodiments, vias 1008 can be formed by forming openings in interlayer dielectric 910 and depositing conductive material in the formed openings. The formation process can be similar to the process for forming backside deep TSVs 850. For example, a patterning process can be used to form openings in interlayer dielectric 910 until underlying via rail 930 is exposed, and a conductive material, such as copper, is deposited in the openings. Via 1006 and 1010 and first interconnect layer M1 can be formed in another interlayer dielectric 1002 that is deposited on interlayer dielectric 910 and semiconductor devices 920. Via 1006 can provide an electrical connection between first interconnect layer M1 and via 1008, while via 1010 can provide an electrical connection between first interconnect layer M1 and terminals of semiconductor devices 920. First interconnect layer M1 and vias 1006 and 1010 can be formed using suitable processes, such as a damascene process, that are similar to those for forming PG wires 774 and 776 and backside TSVs 850, and are not described in detail for simplicity. Similarly, first interconnect layer M1 and vias 1006 and 1010 can be formed using a suitable conductive material, such as copper, aluminum, or cobalt.

Figure 11:
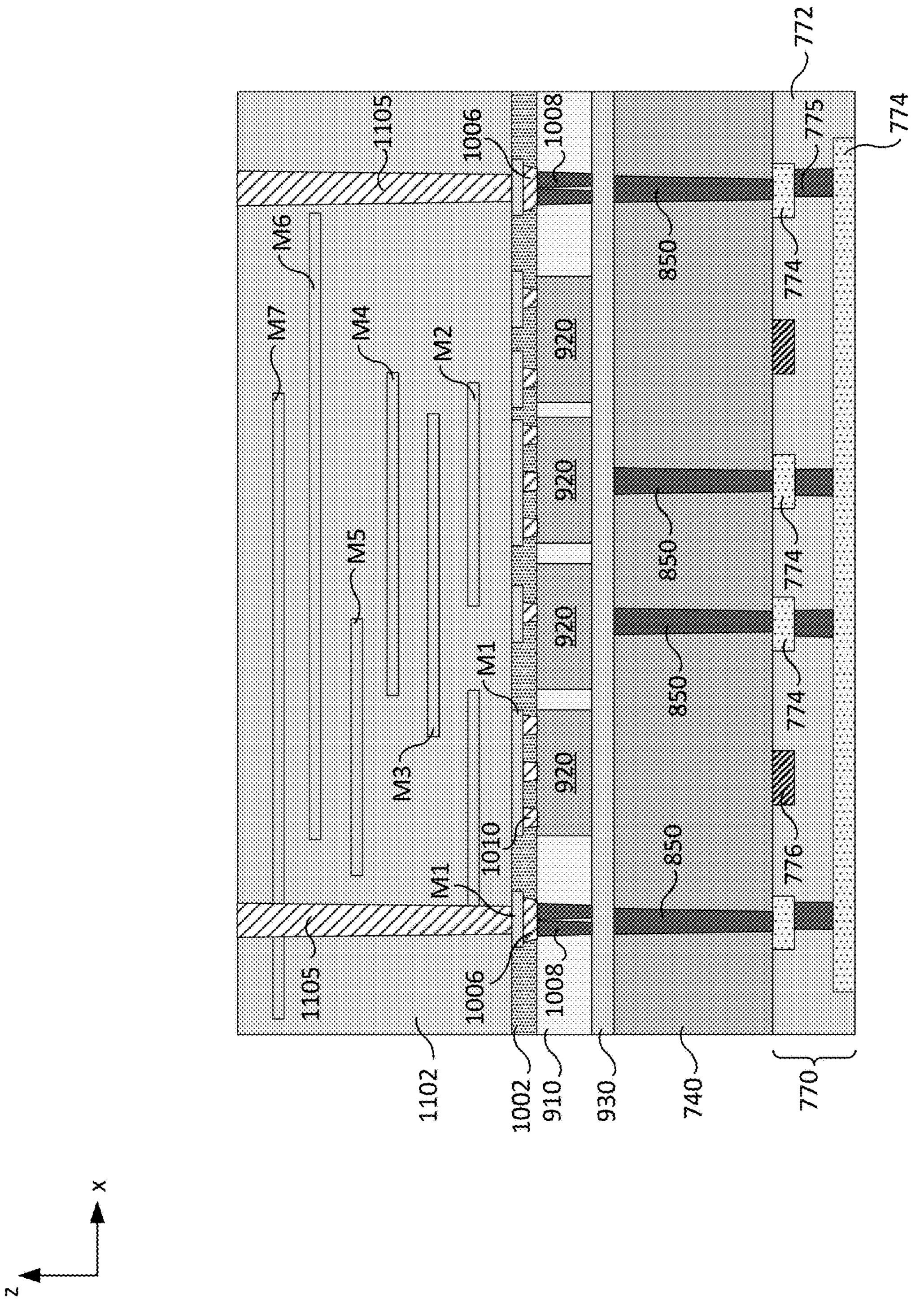

At operation 610, deep TSVs are formed through interlayer dielectrics and between a bottom metal interconnect layer and a top metal interconnect layer, according to some embodiments of the present disclosure. Referring to FIG. 11, deep TSVs 1105 are formed in interlayer dielectric 1102 and are electrically coupled to first interconnect layer M1. In some embodiments, deep TSVs 1105 are in physical contact with first interconnect layer M1. In some embodiments, interlayer dielectric 1102 is deposited on interlayer dielectric 1002 and can be formed using a material similar to interlayer dielectric 1002. For example, interlayer dielectric 1102 can be formed using a suitable low-k dielectric material. In some embodiments, interlayer dielectric 1102 can be formed using a material that is different from the material that forms interlayer dielectric 1002.

Deep TSVs 1105 can be formed in interlayer dielectric 1102 using suitable methods. For example, deep TSVs 1105 can be formed by suitable patterning, etching, and depositing processes. For example, the patterning process can include forming a photoresist layer overlying interlayer dielectric 1102, exposing the photoresist layer to a pattern, performing post-exposure bake processes, and developing the photoresist layer to form a masking element including the resist. The masking element can protect regions of interlayer dielectric 1102, while etch processes are used to form openings in interlayer dielectric 1102. The etching process can be an RIE process and/or other suitable process. The etching process can continue until underlying first interconnect layers M1 are exposed.

After an opening is formed, conductive material can be deposited into the one or more openings using any suitable deposition method, such as CVD, PVD, ALD, electro plating, electroless plating, any suitable deposition process, and/or combinations thereof. After the conductive material is deposited, a planarization process, such as a CMP process, can be performed such that top surfaces of deep TSVs 1105 are substantially co-planar with a top surface of interlayer dielectric 1102. In some embodiments, deep TSVs 1105 can be high aspect ratio vias with aspect ratio between about 20 and about 30, depending on device needs. For example, aspect ratio of deep TSVs 1105 can be about 25. In some embodiments, the aspect ratio of deep TSVs 1105 can be greater than 30. For example, aspect ratio of deep TSVs 1105 can be between about 30 and 40 for IC structures that include multiple layers embedded in interlayer dielectric layer 1102. In some embodiments, a lateral width of deep TSVs 1105 can be between about one time and about 250 times the width of a poly gate or metal gate structure for semiconductor transistor devices. In some embodiments, vertical dimensions of deep TSVs 1105 can be between about 1 and about 2500 times the height of the poly gate or metal gate structure.

In some embodiments, deep TSVs and via towers can be formed in interlayer dielectric 1102, such as those described in semiconductor device 400 of FIG. 4. In some embodiments, deep TSV 1105 can be formed in interlayer dielectric 1102 and between first interconnect layer M1 and a mid-level interconnect layer such as interconnect layer M4 or M5. The deep TSVs can be similar to the ones illustrated in FIG. 11; however, such deep TSVs would form physical contacts with first interconnect layer M1 and the mid-level interconnect layer, rather than a top interconnect layer such as interconnect layer M8. Via towers can be subsequently formed on the mid-level interconnect layer and electrically coupled to the deep TSVs. Via towers can include vias that are formed using suitable processes, such as a damascene process, and formed between adjacent interconnect layers, such as between interconnect layers M5 and M6, M6 and M7, and/or M7 and M8.

Figure 12:
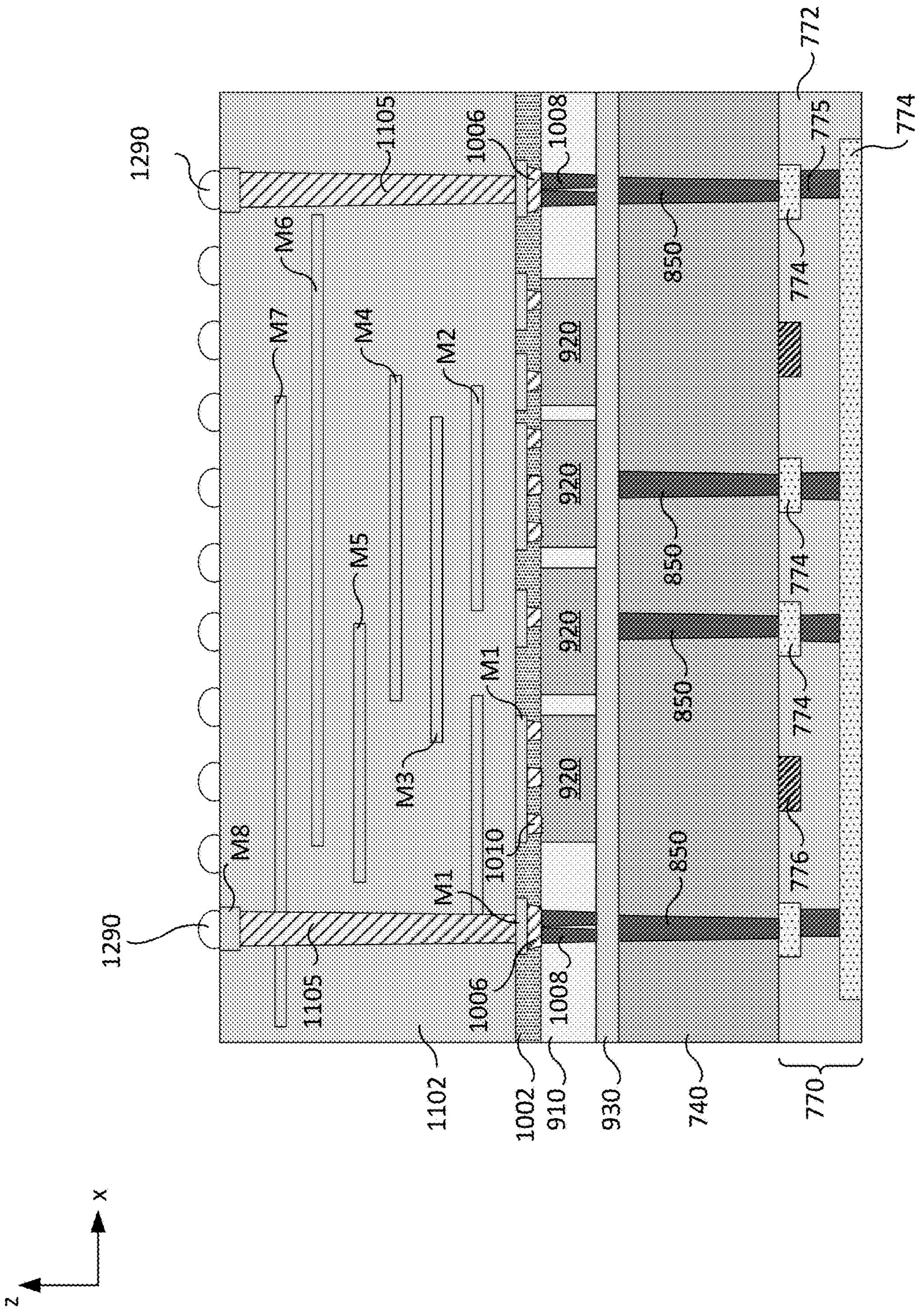

At operation 612, power supply in/out layers are formed on the interlayer dielectrics to form electrical connections to the deep TSVs, according to some embodiments of the present disclosure. Referring to FIG. 12, power supply in/out layers can be formed on interlayer dielectric 1102 and on a top interconnect layer, such as interconnect layer M8. Interconnect layer M8 can be formed on and electrically coupled to deep TSV 1105. In some embodiments, power supply in/out layers can include package bumps 1290. In some embodiments, package bumps 1290 are conductive structures, such as solder balls, that can be electrically connected to power supplies or other packages to form PoP structures. In some embodiments, there can be UBM structures formed under their respective package bumps 1290. In some embodiments, package bumps 1290 can be connected to a voltage supply or voltage reference signal. For example, package bumps 1290 can be connected to the $V_{DD}$ power supply. In some embodiments, package bumps 1290 can be used to transmit electrical signals.

Various embodiments in the present disclosure are directed to via structures and a backside PDN to address IR drops in semiconductor devices and integrated circuits. Specifically, embodiments at least include features such as (i) power distribution network formed on a backside of the IC structure; (ii) frontside deep through silicon via for delivering power to the backside power distribution network through interconnect layer and device layer; and (iii) via towers with frontside short vias. The backside power distribution network and frontside deep through silicon vias can provide benefits of, among other things, (i) decrease IR drops from power source to embedded devices; and (ii) increase routing space for signal lines within the interlayer dielectric layer. It should be noted that the structures and methods described in the present application can also be applied to other conductive structures, such as signal carrying wires, ground wires, and any other suitable conductive structures.

In some embodiments, a semiconductor structure includes a power distribution network including a first conductive line and a second conductive line. The semiconductor structure also includes a substrate having a first surface that is in contact with the power distribution network. The semiconductor structure also includes a plurality of backside vias in the substrate and electrically coupled to the first conductive line. The semiconductor structure also includes a via rail formed on a second surface of the substrate, wherein the first and second surface oppose each other. The semiconductor structure also includes: a first interlayer dielectric on the via rail and on the substrate; a second interlayer dielectric on the first interlayer dielectric; and a third interlayer dielectric on the second interlayer dielectric. A first interconnect layer is in the second interlayer dielectric and a top interconnect layer is in the third interlayer dielectric. The semiconductor structure further includes a plurality of deep vias in the third interlayer dielectric and electrically coupled to the via rail, wherein the plurality of deep vias are connected to the first interconnect layer and the top interconnect layer. The semiconductor structure also includes power supply in/out layer on the third interlayer dielectric and in contact with the top interconnect layer.

In some embodiments, a semiconductor structure includes a power distribution network that includes a first conductive line and a second conductive line. The semiconductor structure also includes a substrate having a first surface, wherein the first surface is in contact with the first conductive line. The semiconductor structure also includes a plurality of backside vias in the substrate and electrically coupled to the first conductive line. A via rail is formed on a second surface of the substrate and the first and second surface oppose each other. The semiconductor structure further includes an interlayer dielectric on the substrate and also includes first, second, and third interconnect layers in the interlayer dielectric and on top of each other. The semiconductor structure also includes a plurality of interconnect structures in contact with the first interconnect layer and the via rail. A deep via is in the interlayer dielectric, and the deep via is in contact with the first interconnect layer and the second interconnect layer. The semiconductor structure also includes a plurality of vias formed above the deep via and between the second and third interconnect layers. The semiconductor structure also includes power supply in/out layer on the interlayer dielectric and in contact with the third interconnect layer.

In some embodiments, a method for forming a semiconductor structure includes depositing a dielectric layer on a first surface of a substrate and forming a power distribution network in the dielectric layer. Forming the power distribution network includes depositing a first conductive material to form a first conductive line, wherein the first conductive material is in physical contact with the first surface of the substrate. Forming the power distribution network also includes depositing a second conductive material to form a second conductive line. The method also includes forming a plurality of backside vias in the substrate, wherein the plurality of backside vias are electrically coupled to the first conductive line. The method further includes depositing a via rail on a second surface of the substrate, wherein the first and second surface oppose each other. The method also includes depositing a first interlayer dielectric on the via rail and on the substrate and depositing a second interlayer dielectric on the first interlayer dielectric. The method further includes depositing a third interlayer dielectric on the second interlayer dielectric and forming a first interconnect layer in the third interlayer dielectric. The method also includes etching the first, second and third interlayer dielectric to form openings and exposing portion of the first interconnect layer. The method further includes depositing conductive material into the openings to form a plurality of deep vias in the first, second and third interlayer dielectric, wherein the plurality of deep vias are connected to the first interconnect layer and electrically coupled to the via rail. The method further includes forming a top interconnect layer on the plurality of deep vias and in the third interlayer dielectric, wherein the top interconnect layer is in contact with the plurality of deep vias. The method further includes forming power supply in/out layer on the third interlayer dielectric and in contact with the top interconnect layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
- a substrate comprising a front-side surface and a back-side surface;
- a first through-via disposed in the substrate;
- a first interconnect structure disposed on the back-side surface of the substrate and electrically connected to the first through-via;
- a via rail disposed on the front-side surface of the substrate; a second interconnect structure, comprising:
  - a dielectric layer disposed on the via rail;
  - a plurality of interconnect levels disposed in the dielectric layer; and
  - a second through-via extending from a bottommost interconnect level in the plurality of interconnect levels to a topmost interconnect level in the plurality of interconnect levels; and
- a device layer disposed between the second interconnect structure and the via rail.

2. The structure of claim 1, wherein the first through-via extends from the front-side surface to the back-side surface of the substrate.

3. The structure of claim 1, wherein the second through-via is electrically connected to a metal line of the bottommost interconnect level and to a metal line of the topmost interconnect level.

4. The structure of claim 1, wherein the second through-via is electrically connected to the via rail.

5. The structure of claim 1, wherein the first through-via is aligned to the second through-via.

6. The structure of claim 1, wherein the device layer comprises a via structure; and wherein the first through-via is electrically connected to the second through-via through the via structure.

7. The structure of claim 6, wherein the first through-via, the second through-via, and the via structure are vertically stacked on each other.

8. The structure of claim 1, wherein the first interconnect structure comprises a via structure electrically connected to the first and second through-vias.

9. The structure of claim 1, wherein the first interconnect structure comprises a via structure vertically stacked with the first and second through-vias.

10. The structure of claim 1, wherein the first interconnect structure comprises a metal line with vertical and horizontal dimensions greater than vertical and horizontal dimensions of metal lines in the plurality of interconnect levels.

11. A structure, comprising:
- a substrate comprising a first surface and a second surface;
- a through-silicon via extending from the first surface to the second surface of the substrate;
- a first interconnect structure disposed on the first surface of the substrate;
- a via rail disposed on the second surface of the substrate;
- a second interconnect structure, comprising:
  - a dielectric layer disposed on the via rail;
  - a stack of interconnect layers disposed in the dielectric layer;
  - a first through-via extending from a bottommost interconnect layer in the stack of interconnect layers to a mid-level interconnect layer in the stack of interconnect layers; and
  - a second through-via extending from the mid-level interconnect layer to a topmost interconnect layer in the stack of interconnect layers; and
- a device layer disposed between the second interconnect structure and the via rail.

12. The structure of claim 11, wherein the second through-via is vertically stacked on the first through-via.

13. The structure of claim 11, wherein the second interconnect structure further comprises:
- a third through-via extending from the bottommost interconnect layer to the mid-level interconnect layer; and
- a via tower comprising a stack of vias extending from the mid-level interconnect layer to the topmost interconnect layer.

14. The structure of claim 11, wherein the through-silicon via, the via structure, the first through-via, and the second through-via are vertically stacked on each other.

15. The structure of claim 11, wherein the stack of interconnect layers comprises a plurality of interconnect layers between the bottommost interconnect layer and the mid-level interconnect layer.

16. The structure of claim 11, wherein the stack of interconnect layers comprises a plurality of interconnect layers between the mid-level interconnect layer and the topmost interconnect layer.

17. A structure, comprising:
a substrate comprising a first surface and a second surface;
a power distribution network disposed on the first surface of the substrate;
a power rail disposed on the second surface of the substrate;
a device layer disposed on the power rail; and
a multi-level interconnect structure, comprising:
a dielectric layer disposed on the device layer;
a stack of interconnect layers disposed in the dielectric layer; and
a through-via extending from a bottommost interconnect layer in the stack of interconnect layers to a topmost interconnect layer in the stack of interconnect layers.

18. The structure of claim 17, wherein the power distribution network is electrically connected to the through-via.

19. The structure of claim 17, wherein the device layer comprises a via structure electrically connected to the through-via.

20. The structure of claim 17, wherein the stack of interconnect layers comprises a plurality of interconnect layers between the bottommost interconnect layer and the topmost interconnect layer.

* * * * *